US011347267B2

(12) United States Patent
Wolff et al.

(10) Patent No.: US 11,347,267 B2
(45) Date of Patent: May 31, 2022

(54) ARC BAR FLEXIBLE DISPLAY

(71) Applicant: HEWLETT-PACKARD DEVELOPMENT COMPANY, L.P., Houston, TX (US)

(72) Inventors: Stacy L. Wolff, Houston, TX (US); Seongmin Hwang, London (GB); Stephen Philip De Saulles, London (GB); Kevin L Massaro, Houston, TX (US); Dimitre Mehandjiysky, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 729 days.

(21) Appl. No.: 16/074,314

(22) PCT Filed: Aug. 12, 2016

(86) PCT No.: PCT/US2016/046842
§ 371 (c)(1),
(2) Date: Jul. 31, 2018

(87) PCT Pub. No.: WO2018/031040
PCT Pub. Date: Feb. 15, 2018

(65) Prior Publication Data
US 2021/0181797 A1    Jun. 17, 2021

(51) Int. Cl.
*G06F 1/16* (2006.01)
*H01L 51/52* (2006.01)

(52) U.S. Cl.
CPC .......... *G06F 1/1652* (2013.01); *G06F 1/1656* (2013.01); *H01L 51/52* (2013.01); *H01L 2251/5338* (2013.01)

(58) Field of Classification Search
CPC .... G06F 1/1652; G06F 1/1656; G06F 1/1601; G06F 2203/04102; H01L 51/52; H01L 2251/5338
See application file for complete search history.

(56) References Cited

U.S. PATENT DOCUMENTS 9,081,540 B1 *  7/2015  Cho .................. G06F 1/1601
9,274,560 B2    3/2016  Ahn
(Continued)

FOREIGN PATENT DOCUMENTS

CN    103489371 A    1/2014
CN    103559835 A    2/2014
(Continued)

OTHER PUBLICATIONS

Dashevsky, "A Laptop that can be Rolled-Up, Other Flexible Bendable Displays", Retrieved from Internet—http://www.extremetech.com/computing/83988-a-laptop-that-can-be-rolledup-other-flexible-bendable-displays, Jan. 20, 2011, 4 Pages.

*Primary Examiner* — Abhishek M Rathod
(74) *Attorney, Agent, or Firm* — Brooks Cameron & Huebsch PLLC

(57) ABSTRACT

Example implementations relate to an arc bar flexible display. For example, an apparatus includes a flexible display device and a support structure adjacent to the flexible display device. The apparatus also includes an arc bar device coupled to the support structure, where a portion of the arc bar device is slidable within a guide mechanism to allow the flexible display device to transform from a flat configuration to a curved configuration.

14 Claims, 5 Drawing Sheets

(56) References Cited

U.S. PATENT DOCUMENTS

| | | | |
|---|---|---|---|
| 9,320,138 B2 | 4/2016 | Lee et al. | |
| 9,829,069 B2 * | 11/2017 | Park | F16H 1/16 |
| 2007/0241002 A1 | 10/2007 | Wu et al. | |
| 2013/0207946 A1 | 8/2013 | Kim et al. | |
| 2013/0329162 A1 * | 12/2013 | Fujii | G09F 9/301 |
| | | | 349/58 |
| 2014/0268584 A1 * | 9/2014 | Song | G02F 1/133308 |
| | | | 361/728 |
| 2015/0029166 A1 * | 1/2015 | Park | G09G 3/20 |
| | | | 345/184 |
| 2015/0185761 A1 * | 7/2015 | Song | G06F 1/1601 |
| | | | 361/679.21 |
| 2015/0355675 A1 | 12/2015 | Lv et al. | |
| 2017/0188470 A1 * | 6/2017 | Cho | G09F 9/301 |
| 2017/0205658 A1 * | 7/2017 | Jung | H04N 5/64 |
| 2018/0033344 A1 * | 2/2018 | Chen | H01L 51/0097 |

FOREIGN PATENT DOCUMENTS

| | | |
|---|---|---|
| CN | 204516278 U | 7/2015 |
| CN | 105047084 A | 11/2015 |
| CN | 105118401 A | 12/2015 |
| CN | 105681707 | 6/2016 |
| KR | 1020140002243 | 4/2014 |
| KR | 1020150088605 | 8/2015 |
| KR | 2015-0125140 | 11/2015 |
| KR | 1020150004194 | 11/2015 |

* cited by examiner

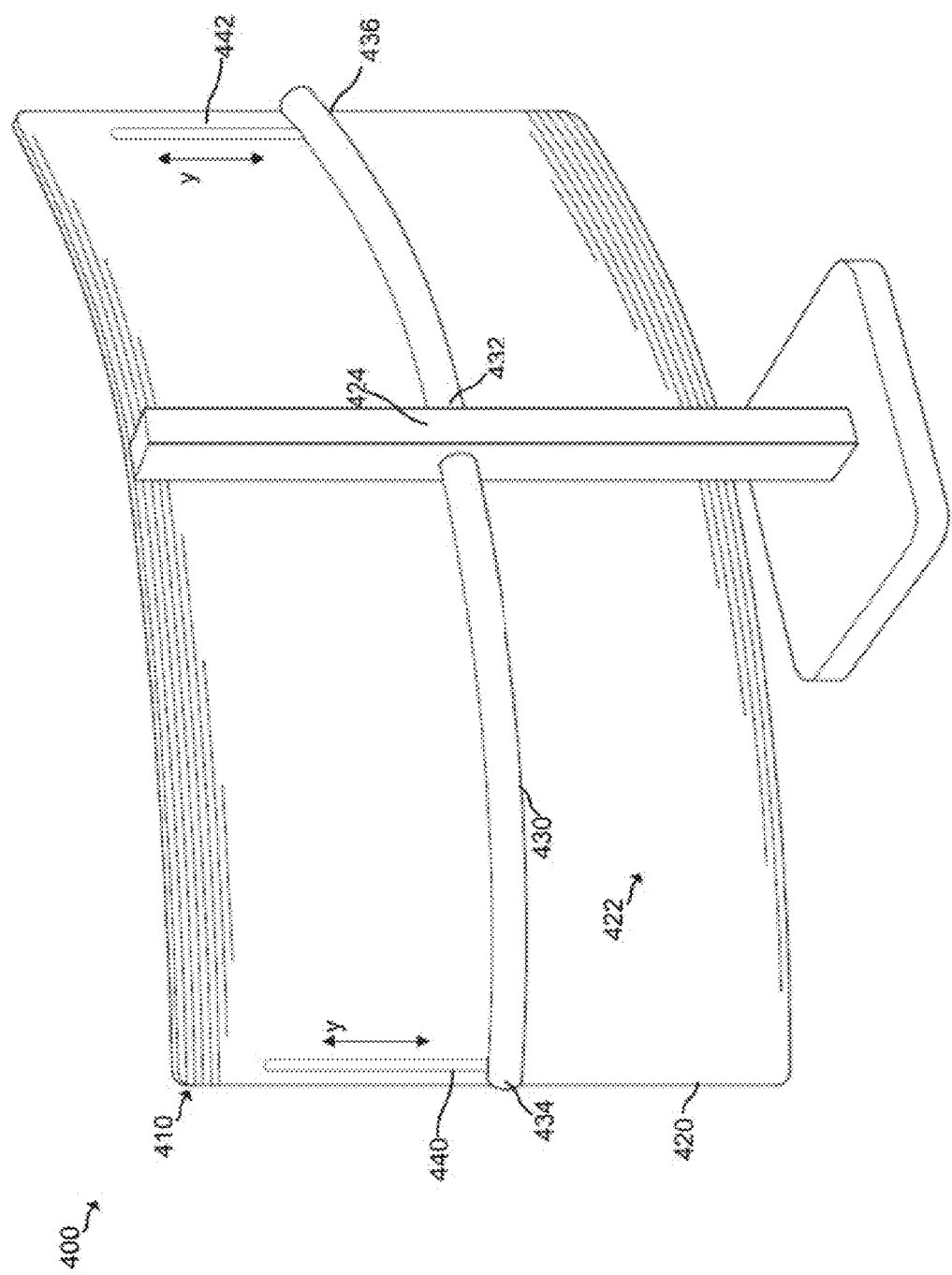

ARC BAR FLEXIBLE DISPLAY

BACKGROUND

Display devices come in any number of designs and sizes, such as display monitors coupled to computing devices, all-in-one computing devices that include the display, tablets, laptop displays, and the like, These devices have traditionally been flat screen devices. However, current technology now allows for display devices that are flexible.

BRIEF DESCRIPTION OF THE DRAWINGS

Some examples of the present application are described with respect to the following figures:

FIG. 5 illustrates a rear view of an example display having a flexible display device that is in a curved configuration.

DETAILED DESCRIPTION

As described above, current technology allows for flexible display devices, Flexible display devices may be made of any suitable flexible material capable of displaying content, such as organic light-emitting diode (OLEO) flexible display devices. While the shape of these display devices can be changed due to their flexible nature, holding a stable shape for these display devices can be problematic. As such, examples discussed herein include an arc bar flexible display device that includes an arc bar device to aid in the transformation and stability of a flexible display device from a flat configuration to a curved configuration.

Figure 1:
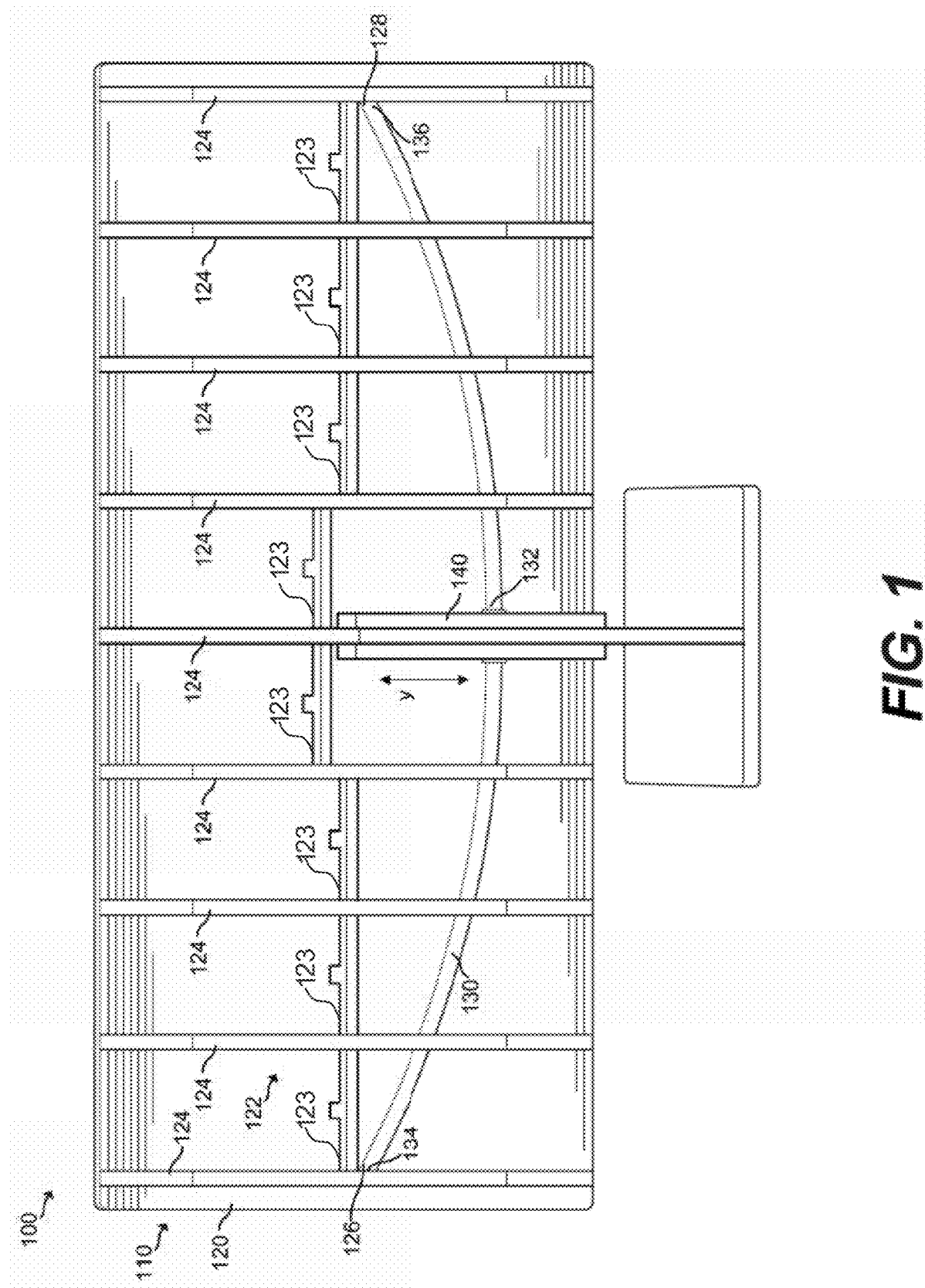
FIG. 1 illustrates a rear view of an example e apparatus having flexible display device that is in a flat configuration.

Referring now to the figures, FIG. 1 illustrates a rear view of an, example apparatus 100 having a flexible display device 110 that is in a fiat configuration, As used herein, the rear view of the apparatus 100 is the side that is opposite to the side on which content is displayed to a user. The apparatus 100 may be any suitable display device, such as a monitor, a tablet, an all-in-one personal computer, and the like. As shown in FIG. 1, the apparatus is in a fiat configuration, which may be useful for presenting content to multiple viewers.

The flexible display device 110 is located at the front of the apparatus 100, which is on the side opposite to that shown in FIG. 1 (e.g., on the side that a user would face when viewing content displayed by the apparatus 100) and may be any suitable flexible display device capable of displaying content, such as an OLEO flexible display device.

The flexible display device 110 may be adjacent to the support structure 120, which may be any suitable support structure to support the flexible display device 110. The support structure 120 may include a flexible surface 122 and a plurality of stability pieces 124 connected to the flexible surface 122. The flexible surface 122 may be made of any suitable flexible material that may have some resistance to being curved, such as continuous a flexible plastic, sheet metal, and the like.

Each stability piece 124 may control and form the flexible surface 122 such that the flexible surface 122 may be a similar curve to the curve of the arc bar device 130 so that the support structure 120 is a close fit around the diameter of the arc bar device 130. The stability pieces 124 allow the form of the support structure 120 to closely match the form of the arc bar device 130. The stability pieces 124 may also impart rigidity to the flexible surface 122 in the y-axis direction where flex may not be desirable. The stability pieces 124 may be connected to each other using any suitable connecting devices such that the support structure 120 is capable of maintaining the shape of the flexible display device 110 as it is flexed. For example, the plurality of stability pieces 124 may be connected to each other using torque hinges 123. In some examples, a hinge 123 may be torqued by a spring that is matched in force to overcome the bias in the flexible surface 122, such that the arc bar device 130 may be held in an overcentre upward position controlled by a profiled cam lever held within the center stability piece 124. In some examples, there may be T-shaped components between each stability piece 124 to prevent inflection of the apparatus 100 such that the apparatus is capable of curving in one direction.

Arc bar device 130 may be a rigid bar that is in the shape of an arc and may be made of any suitable rigid material (e.g., metal, etc.). The arc bar device 130 may be coupled to the support structure 120 in any suitable manner. For example, the arc bar device 130 may run through apertures in each of the stability pieces 124. The center portion 132 of the arc bar device 130 may be slidable through a guide mechanism 140, which may be any suitable mechanism to allow the center portion 132 of the arc bar device 130 to slide vertically within the guide mechanism 140. The guide mechanism 140 may be connected to the support structure 120 along a center y-axis of the support structure 120.

In the example of FIG. 1, each end of the arc bar device 130 may be rotatably fixed to the center of each lateral end of the support structure 120 (e.g., via a central guide bush of the lateral ends of the support structure 120) to prevent sideways movement of the arc bar device 130 but to allow the ends 134 and 136 of the arc bar device 130 to rotate. For example, the end 134 of the arc bar 130 may be rotatably fixed to the center of the lateral end 126 of the support structure 120, and the end 136 of the arc bar 130 may be rotatably fixed to the center of the lateral end 128 of the support structure 120.

Figure 2:
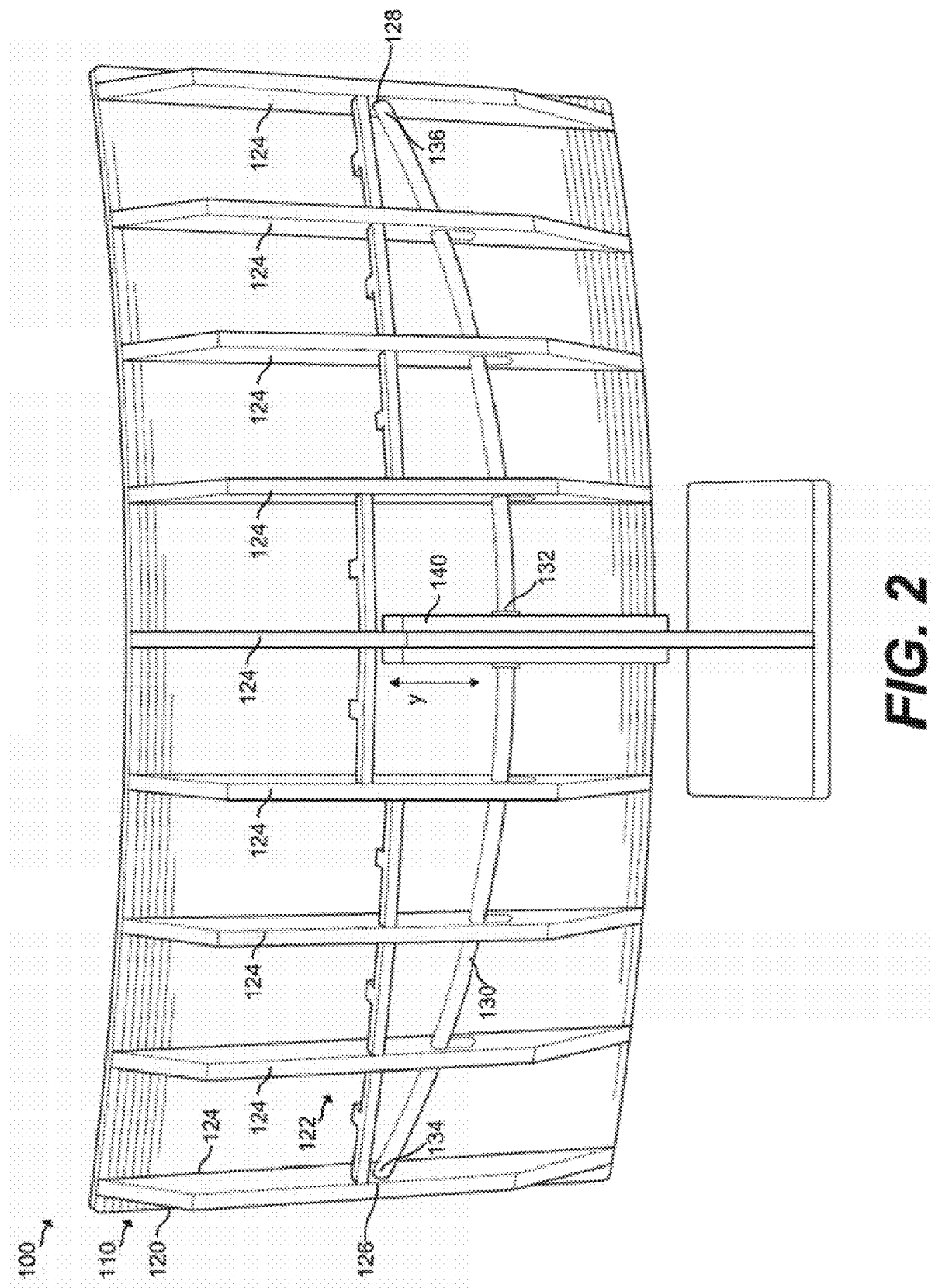
FIG. 2 illustrates a rear view of an example apparatus having a flexible display device that is in a curved configuration.

The arc bar device 130 may allow the apparatus 100 to change from the flat configuration shown in FIG. 1 to the curved configuration shown in FIG. 2, which illustrates the rear view of the example apparatus 100 having the flexible display device 110 that is in a curved configuration. FIG. 2 includes all of the components shown in FIG. 1 but in the curved configuration, which may be useful when a single viewer wishes to view content, giving the viewer a more immersive experience, For example, a use facing the front of the apparatus 100 may transform the apparatus 100 from the flat configuration of FIG. 1 to the curved configuration of FIG. 2 by pulling the lateral ends of the support structure 120 toward each other, which may cause the center portion 132 of the arc bar device 130 to rotatably slide upward along the y-axis within the guide mechanism 140 to allow the flexible display device 110 to transform to the curved configuration of FIG. 2. As the apparatus 100 is flexed into a curved configuration, the center portion 132 of the arc bar device 130 slides upward within the guide mechanism 140, which may also cause the guide mechanism itself to move upward along the y-axis. The curved configuration may be held and maintained by the arc bar device 130.

Figure 3:
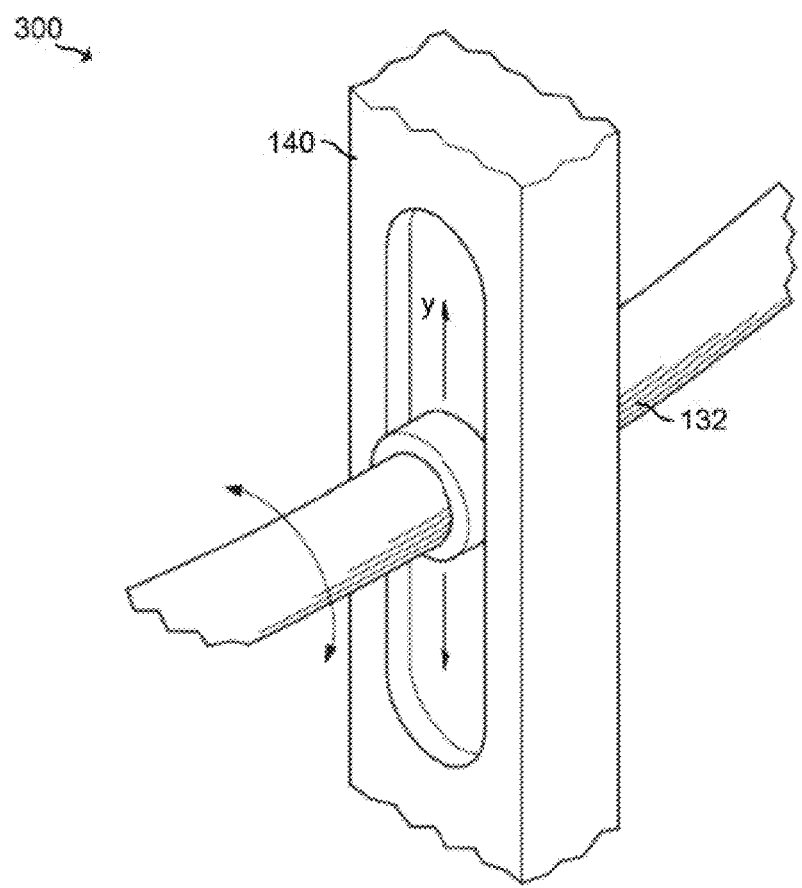
FIG. 3 illustrates a side view an example guide mechanism of a flexible d play apparatus.

FIG. 3 illustrates a side view 300 of an example guide mechanism 140 of the flexible display apparatus 100 of FIGS. 1 and 2. The side view 300 is a zoomed-in view of the side of the guide mechanism 140 of FIGS. 1 and 2. As shown in FIG. 3, the center portion 132 of the arc bar device 130 is rotatable and slidable in the y-axis direction within the guide mechanism 140. As the apparatus 100 is transformed from a flat configuration to a curved configuration, the center portion 132 of the arc bar device 130 slides upward in the y-axis direction within the aperture of the guide mechanism 140 to allow the curved configuration to be maintained.

Figure 4:
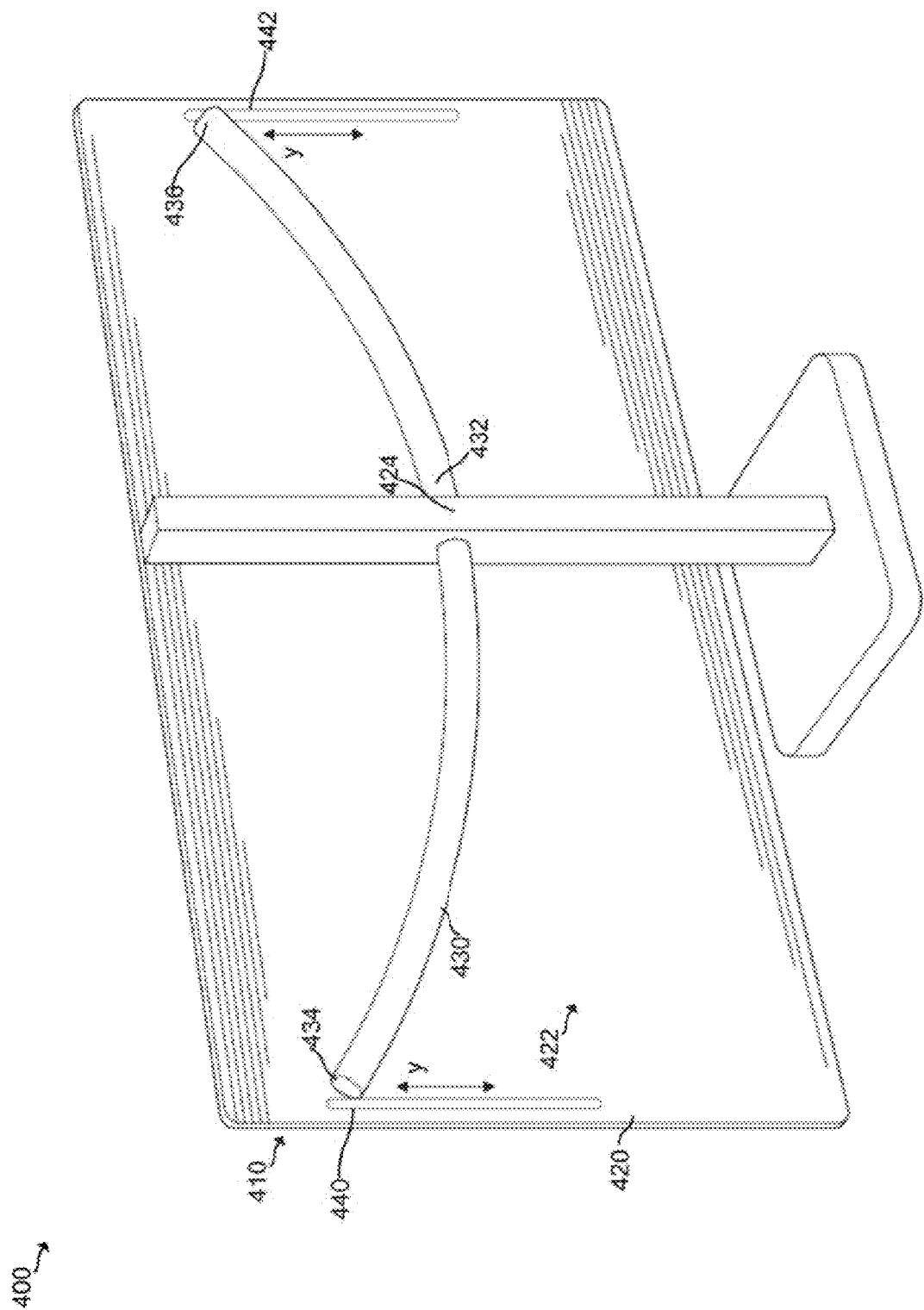
FIG. 4 illustrates a rear view of an example display having a flexible display device that is in a flat configuration.

FIG. 4 illustrates a rear view of an example display 400 having a flexible display device 410 that is in a flat configuration. The display 400 of FIG. 4 is similar to the apparatus 100 of FIGS. 1 and 2, except for the portions of the arc bar device that are rotatably fixed to the support structure, as described above. In FIGS. 1 and 2, the ends 134 and 136 of the arc bar device 130 are rotatably fixed to the centers of the lateral ends 126 and 128 of the support structure 120, while the center portion 132 of the arc bar device 130 are slidable within the guide mechanism 140. In FIG. 4, the ends 434 and 436 of the arc bar device 430 are slidable within their respective guide mechanisms 440 and 442 at each lateral end of the support structure 420, while the center portion 432 of the arc bar device 430 is rotatably fixed to a center 424 of the support structure 420.

In FIG. 4, the display 400 includes a flexible display device 410 similar to the flexible display device 110 of FIGS. 1 and 2 and a support structure 420. The support structure 420 may have a flexible surface 422 similar to the flexible surface 122 of FIGS. 1 and 2 as well as a center 424 of the support structure 420. The display 400 may also include the arc bar device 430 having a center portion 432 and ends 434 and 436, similar to the arc bar device 130 of FIGS. 1 and 2. Each guide mechanism 440 and 442 may be any suitable guide mechanism to allow the respective end of the arc bar device 430 to slide vertically within the guide mechanism. For example, the guide mechanism 440 may be connected to the support structure 420 along a lateral y-axis of the support structure 420, where the end 434 of the arc bar device 430 may be slidable within the guide mechanism 440. Similarly, the guide mechanism 442 may be connected to the support structure 420 along a lateral y-axis of the support structure 420, where the end 436 of the arc bar device 430 may be slidable within the guide mechanism 442.

The arc bar device 430 may allow the display 400 to change from the flat configuration shown in FIG. 4 to the curved configuration shown in FIG. 5, which illustrates the rear view of the example display 400 having a flexible display device 410 that is in a curved configuration. FIG. 5 includes all of the components of FIG. 4 but in the curved configuration. In some examples, a user may transform the display 400 from the flat configuration of FIG. 4 to the curved configuration of FIG. 5 by pulling the lateral ends of the support structure 420 toward each other, which may cause the ends 434 and 436 of the arc bar device 430 to rotatably slide upward along the y-axis within their respective guide mechanisms 440 and 442 to allow the flexible display device 410 to transform to the curved configuration of FIG. 5.

What is claimed is:

1. An apparatus, comprising:
a flexible display device;
a support structure adjacent to the flexible display device comprising:
a flexible surface adjacent to the flexible display device, wherein the flexible display device is on a first side of the support structure; and
an arc bar device coupled to the support structure, wherein a portion of the arc bar device is vertically slidable within a guide mechanism to allow the flexible display device to transform from a flat configuration to a curved configuration, wherein the guide mechanism is positioned substantially in a center of the support structure; and
a plurality of stability pieces, to cause the support structure to match a form of the arc bar device, connected to an outer most surface of the support structure, wherein the outer most surface of the support structure is a second side of the support structure and the plurality of stability pieces extend perpendicular to the second side of the support structure, and wherein the first side of the support structure is opposite to the second side of the support structure.

2. The apparatus of claim 1, wherein the guide mechanism is connected to the support structure along a y-axis of the support structure and wherein the portion of the arc bar device that is slidable within the guide mechanism is a center portion of the arc bar device.

3. The apparatus of claim 2, wherein each end of the arc bar device is rotatably fixed to a center of a lateral end of the support structure.

4. The apparatus of claim 1, wherein the guide mechanism includes a first guide connected to the support structure along a first center y-axis of the support structure and a second guide connected to the support structure along a second center y-axis of the support structure, and wherein the portion of the arc bar device that is slidable within the guide mechanism includes a first center of the arc bar device slidable within the first guide and a second center of the arc bar device slidable within the second guide.

5. The apparatus of claim 4, wherein a center of the arc bar device is rotatably fixed to the center of the support structure.

6. The apparatus of claim 1, wherein the plurality of stability pieces are connected to each other using torqued hinges.

7. The apparatus of claim 1, wherein the flexible display device is an organic light-emitting diode (OLED) flexible display device.

8. A display, comprising:
an organic light-emitting diode (OLED) flexible display device;
a support structure adjacent to the OLED flexible display device comprising:
a flexible surface adjacent to the OLED flexible display device, wherein the flexible display device is on a first side of the support structure;
an arc bar device coupled to the support structure, wherein a portion of the arc bar device is vertically slidable within a guide mechanism to allow the OLED flexible display device to transform from a flat configuration to a curved configuration, wherein the guide mechanism is positioned substantially in a center of the support structure; and
a plurality of stability pieces, to cause the support structure to match a form of the arc bar, connected to an outer most surface of the support structure, wherein the outer most surface of the support structure is a second side of the support structure and the plurality of stability pieces extend perpendicular to the second side of the support structure, and wherein the first side of the support structure is opposite to the second side of the support structure.

9. The display of claim 8, wherein the guide mechanism is connected to the support structure along a y-axis of the support structure and wherein the portion of the arc bar device that is slidable within the guide mechanism is a center portion of the arc bar device.

10. The display of claim 9, wherein each end of the arc bar device is rotatably fixed to a center of a lateral end of the support structure.

11. The display of claim 8, wherein the guide mechanism includes a first guide connected to the support structure along a first center y-axis of the support structure and a second guide connected to the support structure along a second center y-axis of the support structure, and wherein the portion of the arc bar device that is slidable within the guide mechanism includes a first center of the arc bar device slidable within the first guide and a second center of the arc bar device slidable within the second guide.

12. An apparatus, comprising:
a flexible display device;
a support structure adjacent to the flexible display device, the support structure comprising:
  a flexible surface adjacent to the flexible display device, wherein the flexible display device is on a first side of the support structure; and
  a plurality of stability pieces, to cause the support structure to match a form of an arc bar device, connected to an outer most surface of the support structure, wherein the outer most surface of the support structure is a second side of the support structure and the plurality of stability pieces extend perpendicular to the second side of the support structure, wherein the first side of the support structure is opposite to the second side of the support structure, and wherein the plurality of stability pieces are connected to each other using torqued hinges; and the arc bar device coupled to the support structure, wherein a portion of the arc bar device is vertically slidable within a guide mechanism structure to allow the flexible display device to transform from a flat configuration to a curved configuration, wherein the guide mechanism is positioned substantially in a center of the support structure.

13. The apparatus of claim 12, wherein the guide mechanism is connected to the support structure along a y-axis of the support structure and wherein the portion of the arc bar device that is slidable within the guide mechanism is a center portion of the arc bar device.

14. The apparatus of claim 12, wherein the guide mechanism includes a first guide connected to the support structure along a first center y axis of the support structure and a second guide connected to the support structure along a second center y-axis of the support structure, and wherein the portion of the arc bar device that is slidable within the guide mechanism includes a first center of the arc bar device slidable within the first guide and a second center of the arc bar device slidable within the second guide.

* * * * *